(12) United States Patent
Nelson

(10) Patent No.: US 11,296,197 B2
(45) Date of Patent: Apr. 5, 2022

(54) POWER GATE WITH METAL ON BOTH SIDES

(71) Applicant: Intel Corporation, Santa Clara, CA (US)

(72) Inventor: Donald W. Nelson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 303 days.

(21) Appl. No.: 15/746,799

(22) PCT Filed: Sep. 25, 2015

(86) PCT No.: PCT/US2015/052375
§ 371 (c)(1),
(2) Date: Jan. 22, 2018

(87) PCT Pub. No.: WO2017/052626
PCT Pub. Date: Mar. 30, 2017

(65) Prior Publication Data
US 2020/0066854 A1 Feb. 27, 2020

(51) Int. Cl.
*H01L 29/417* (2006.01)
*H01L 27/088* (2006.01)
(Continued)

(52) U.S. Cl.
CPC .... *H01L 29/41791* (2013.01); *H01L 27/0886* (2013.01); *H01L 29/66795* (2013.01); *H01L 29/785* (2013.01)

(58) Field of Classification Search
CPC ............. H01L 29/785; H01L 29/66795; H01L 29/41791; H01L 27/0886
See application file for complete search history.

(56) References Cited

U.S. PATENT DOCUMENTS 7,880,284 B2* 2/2011 Zelikson ............. H01L 27/0222
257/678
8,557,632 B1* 10/2013 Or-Bach ................. H01L 23/50
257/E21.499
(Continued)

FOREIGN PATENT DOCUMENTS

| CN | 104078506 | 10/2014 |
| CN | 104541377 | 4/2015 |
| TW | 200511500 | 3/2005 |

OTHER PUBLICATIONS

International Preliminary Search Report for International Patent Application No. PCT/US2015/052375, dated Apr. 5, 2018, 9 pages.
(Continued)

*Primary Examiner* — Sarah K Salerno
(74) *Attorney, Agent, or Firm* — Schwabe, Williamson & Wyatt, P.C.

(57) ABSTRACT

An apparatus including a circuit structure including a device stratum including a plurality of transistor devices each including a first side defined by a gate electrode and an opposite second side; and a gated supply grid disposed on the second side of the structure, wherein a drain of the at least one of the plurality of transistor devices is coupled to the gated supply grid. A method including providing a supply from a package substrate to power gate transistors in a device layer of a circuit structure, the transistors coupled to circuitry operable to receive a gated supply from the power gate transistors; and distributing the gated supply from the power gate transistors to the circuitry using a grid on an underside of the device layer.

13 Claims, 16 Drawing Sheets

(51) Int. Cl.
  *H01L 29/66*      (2006.01)
  *H01L 29/78*      (2006.01)

(56)           References Cited

U.S. PATENT DOCUMENTS 8,574,929 B1 *   11/2013   Or-Bach ............... H01L 27/092
                                                               438/4
  2007/0296002 A1  12/2007   Liang et al.
  2008/0054313 A1   3/2008   Dyer et al.
  2014/0264332 A1   9/2014   Erickson et al.
  2014/0332749 A1* 11/2014   Yokoyama ............ H01L 21/845
                                                               257/4
  2014/0334522 A1  11/2014   Meiser et al.
  2016/0035722 A1*  2/2016   Or-Bach ............... H01L 23/481
                                                             257/504

OTHER PUBLICATIONS

International Search Report and Written Opinion for International Patent Application No. PCT/US2015/052375 dated, Jun. 20, 2016, 13 pgs.
Office Action from Taiwan Patent Application No. 105126396, dated Dec. 10, 2020, 12, pages.
Office Action from Chinese Patent Application No. 201580082487.5, dated Dec. 2, 2020, 7, pages.
Notice of Allowance from Chinese Patent Application No. 201580082487.5, dated Jun. 25, 2021, 8 pages.

* cited by examiner

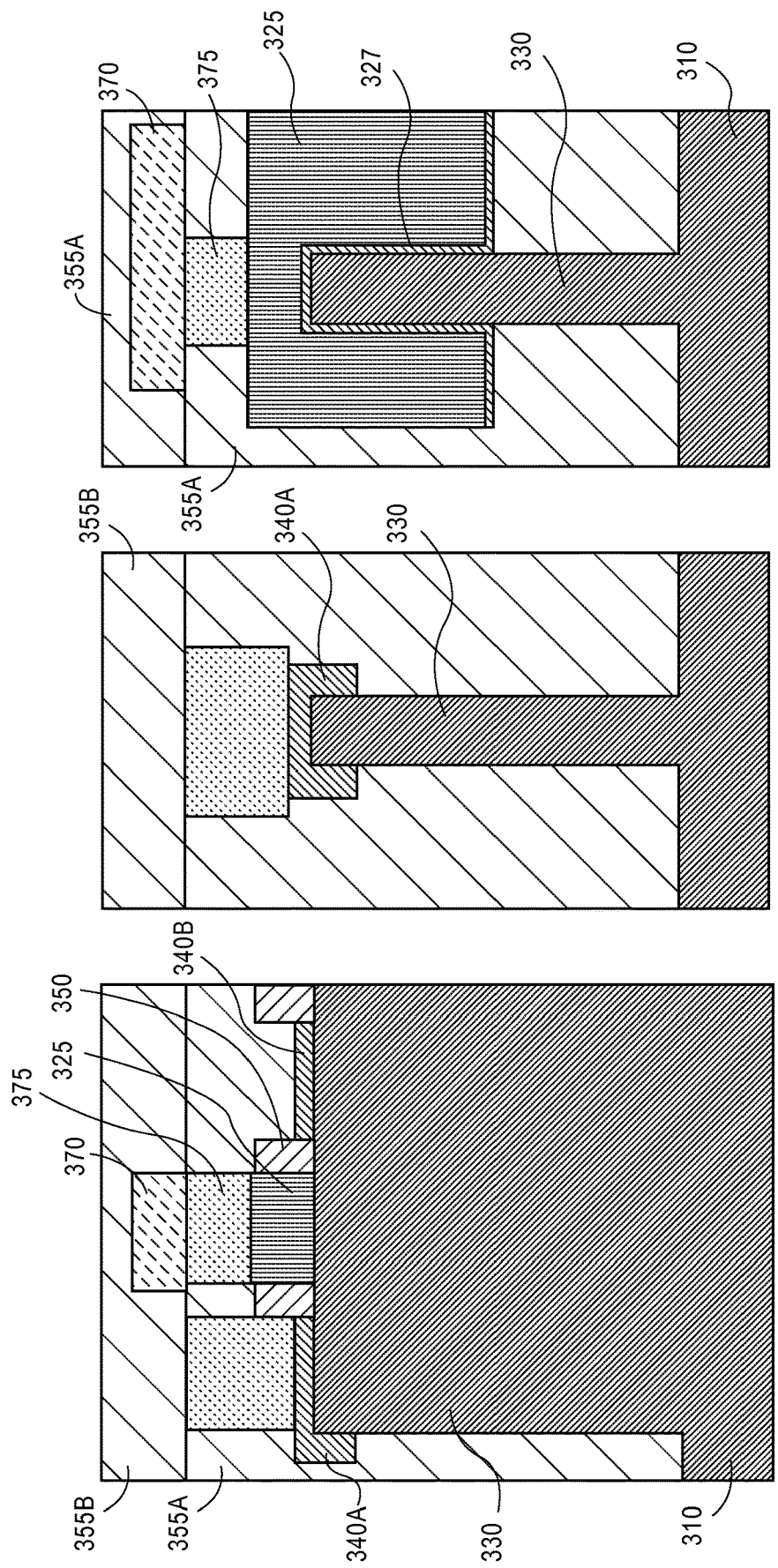

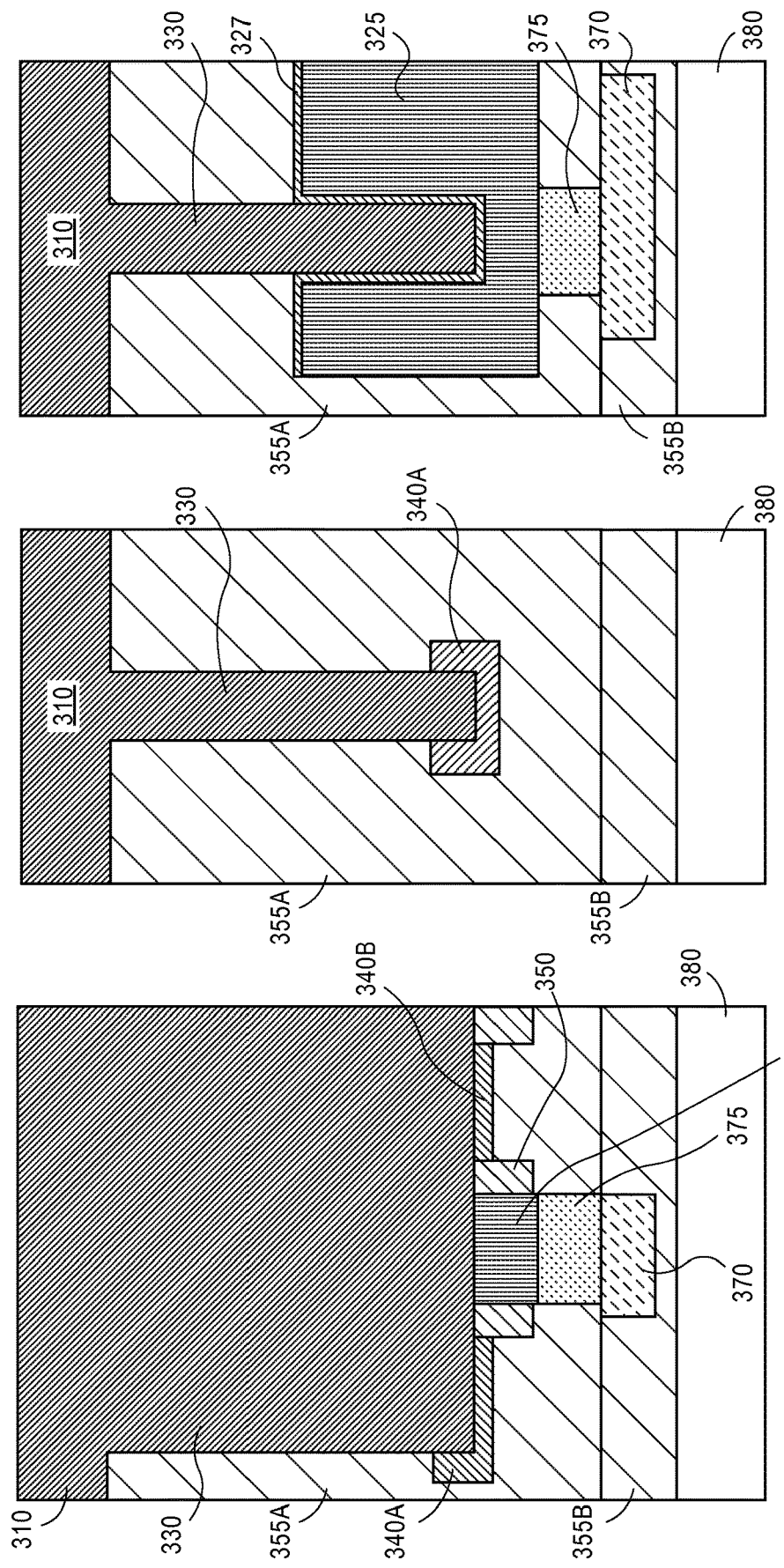

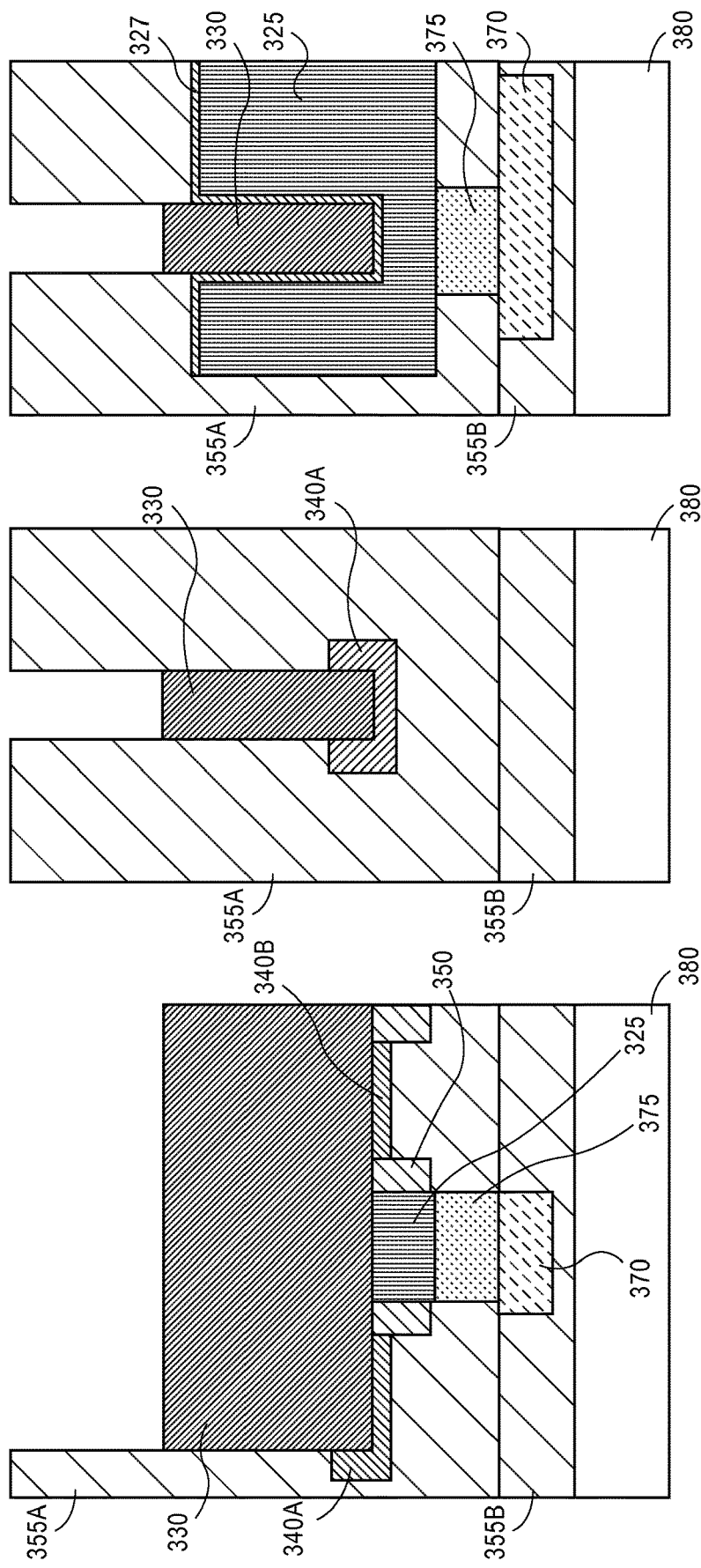

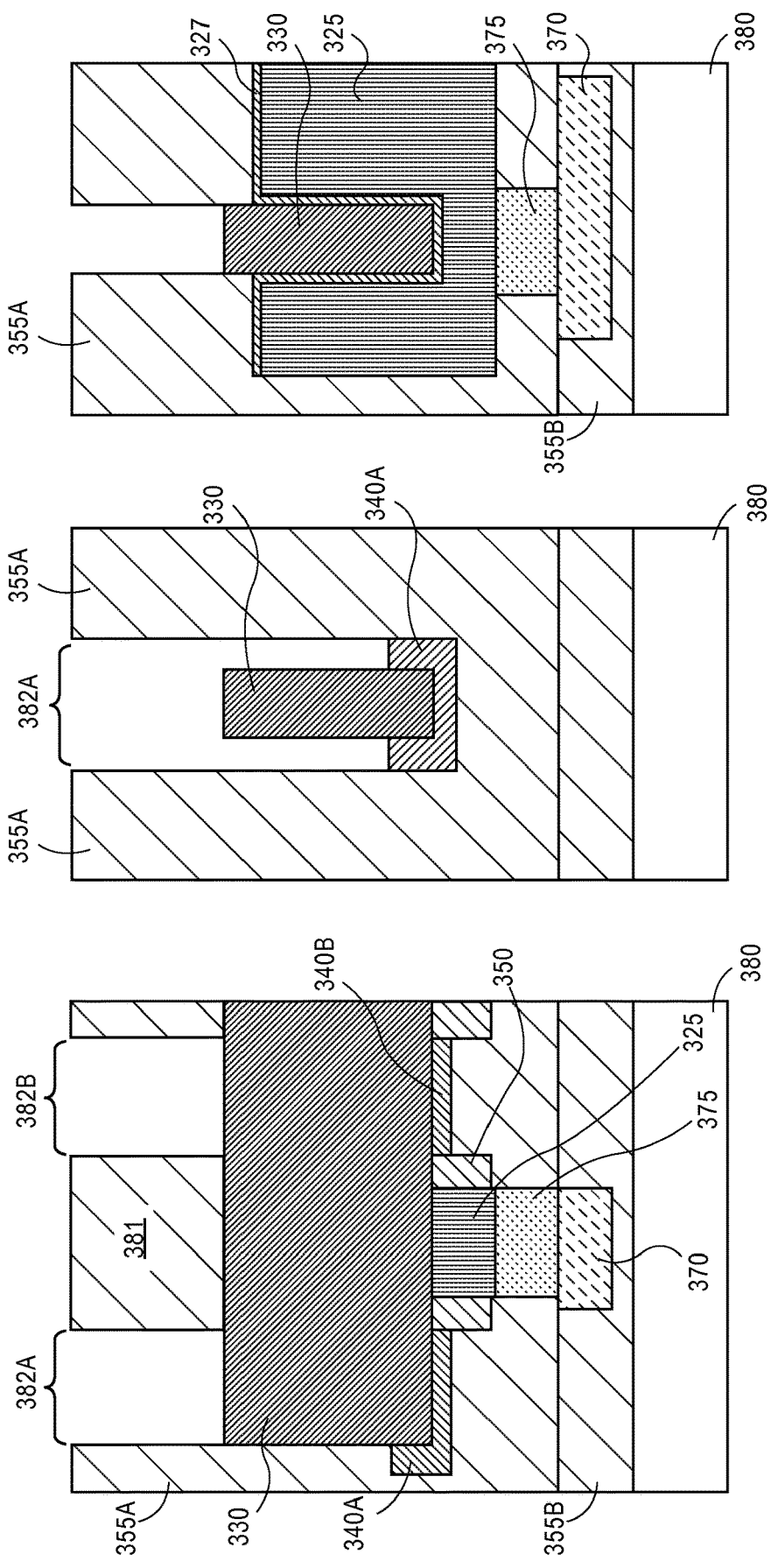

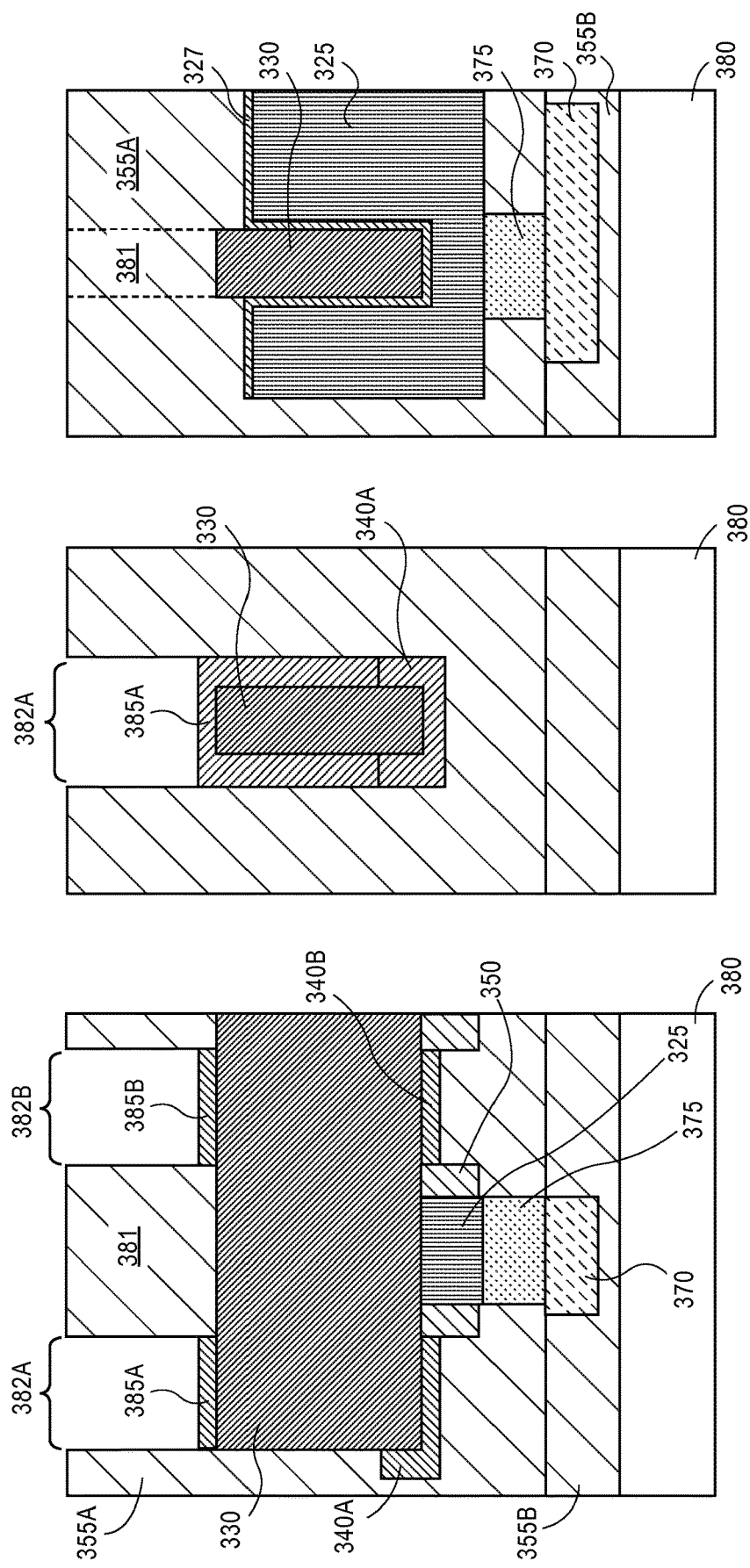

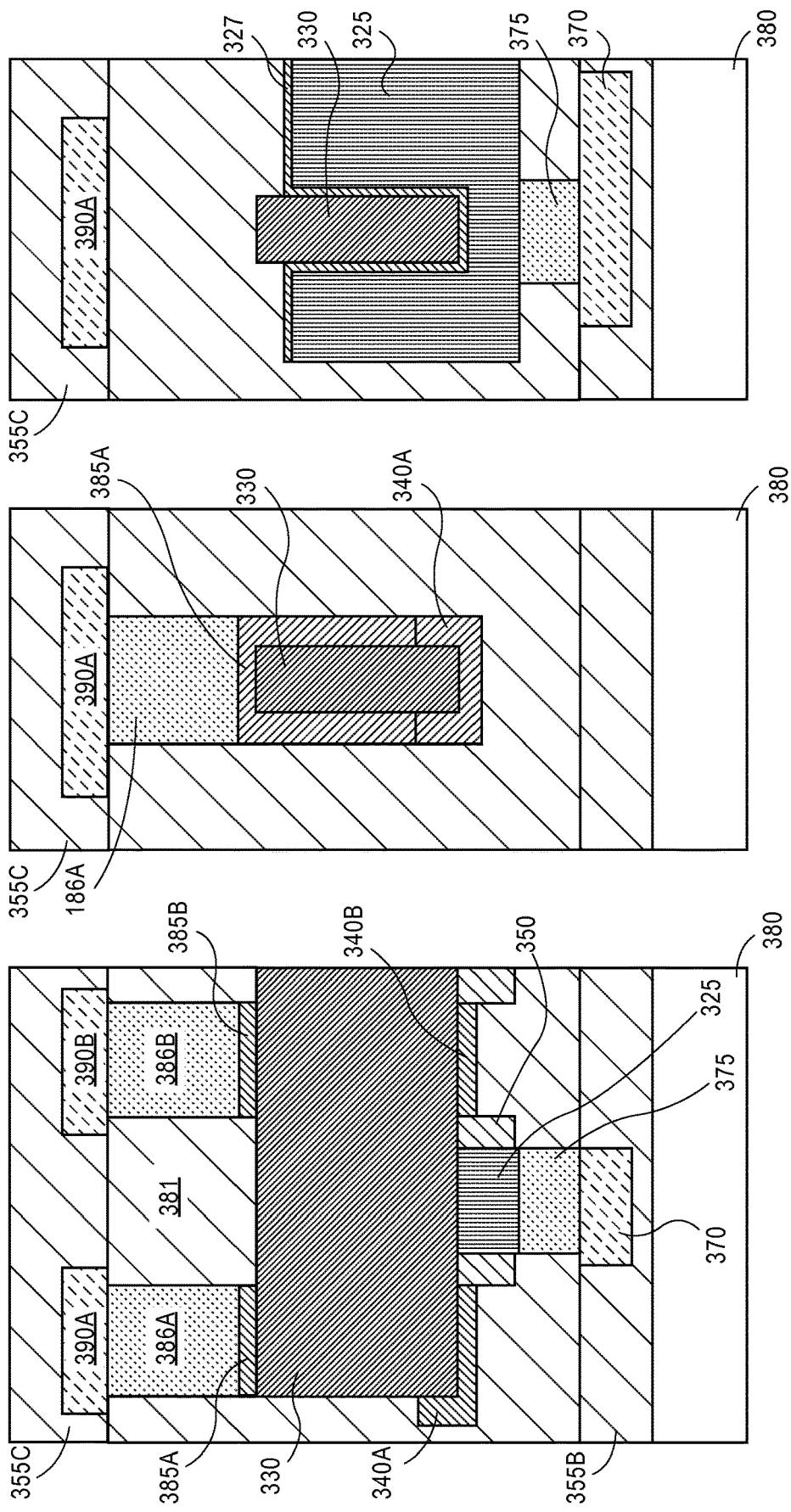

POWER GATE WITH METAL ON BOTH SIDES

CROSS-REFERENCE TO RELATED APPLICATION

This patent application is a U.S. National Phase Application under 35 U.S.C. § 371 of International Application No. PCT/US2015/052375, filed Sep. 25, 2015, entitled "POWER GATE WITH METAL ON BOTH SIDES," which designates the United States of America, the entire disclosure of which is hereby incorporated by reference in its entirety and for all purposes.

TECHNICAL FIELD

Semiconductor devices including devices including electrical connections from a backside of the device.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Future circuit devices, such as central processing unit devices, will desire both high performance devices and low capacitance, low power devices integrated in a single die or chip.

BRIEF DESCRIPTION OF THE DRAWINGS

FIGS. 4A-4C show cross-sectional side views through the structure of FIG. 3.

FIGS. 5A-5C show the structures of FIGS. 4A-4C following the inverting or flipping of the structure and connection of the structure to a carrier.

FIGS. 6A-6C show the structure of FIGS. 5A-5C following the removal or thinning of the device substrate to expose a second side or backside of a fin of the transistor and following a recessing of the fin.

FIGS. 7A-7C shows the structure of FIGS. 6A-6C following the deposition and patterning of a dielectric material on a backside of a fin.

FIGS. 8A-8C show the structure of FIGS. 7A-7C following an epitaxial growth of a material for a backside junction formation.

FIGS. 10A-10C shows the structure of FIGS. 9A-9C and show the interconnect connected to a contact to a source and the interconnect connected to a contact to a source as part of, for example, a first backside interconnect or metal layer.

DETAILED DESCRIPTION

The embodiments described herein are directed to semiconductor devices including non-planar semiconductor devices (e.g., three-dimensional devices) having interconnects or wiring on an underside or backside of the devices, particularly interconnects providing gated power to core logic circuitry. The distribution of gated power is described with power wires ($V_{DD}$, $V_{DD}$-gated, and $V_{ss}$) under a device layer of a circuit structure is described. In one embodiment, an apparatus is disclosed including a circuit structure including a device stratum including a plurality of transistor devices such as, but not limited to, three dimensional or non-planar transistor devices each including a first side or device side defined by a gate electrode on an opposite second side. A gated supply grid is disposed on a second side (backside or underside) of the stratum, wherein a drain of the at least one plurality of transistor devices is coupled to the gated supply grid. A supply grid may also be disposed on the second side of the structure and a source of the at least one plurality of transistor devices may be coupled to the supply grid. By controlling the at least one transistor device through, for example, controlling the gate electrode, a power supply ($V_{DD}$) may be controlled. In another embodiment, a method is described. The method includes providing a supply from a package substrate to power gate transistors in a device layer of a circuit structure, where the transistors are connected to circuitry operable to receive a gated supply from the power gate transistors. The method also includes distributing the gated supply from the power transistors to the circuitry using a grid on an underside of the device stratum. Further disclosed is a system including a package substrate including a supply connection and a die. The die includes core logic circuitry to receive one or more gated supplies and a plurality of transistors defining a device stratum and coupled between the supply connection and the core logic circuitry to control or provide the one or more gated supplies to the core logic circuitry. The gated supplies from the power gate transistors to the circuitry is routed on an underside of the device stratum.

Figure 1:
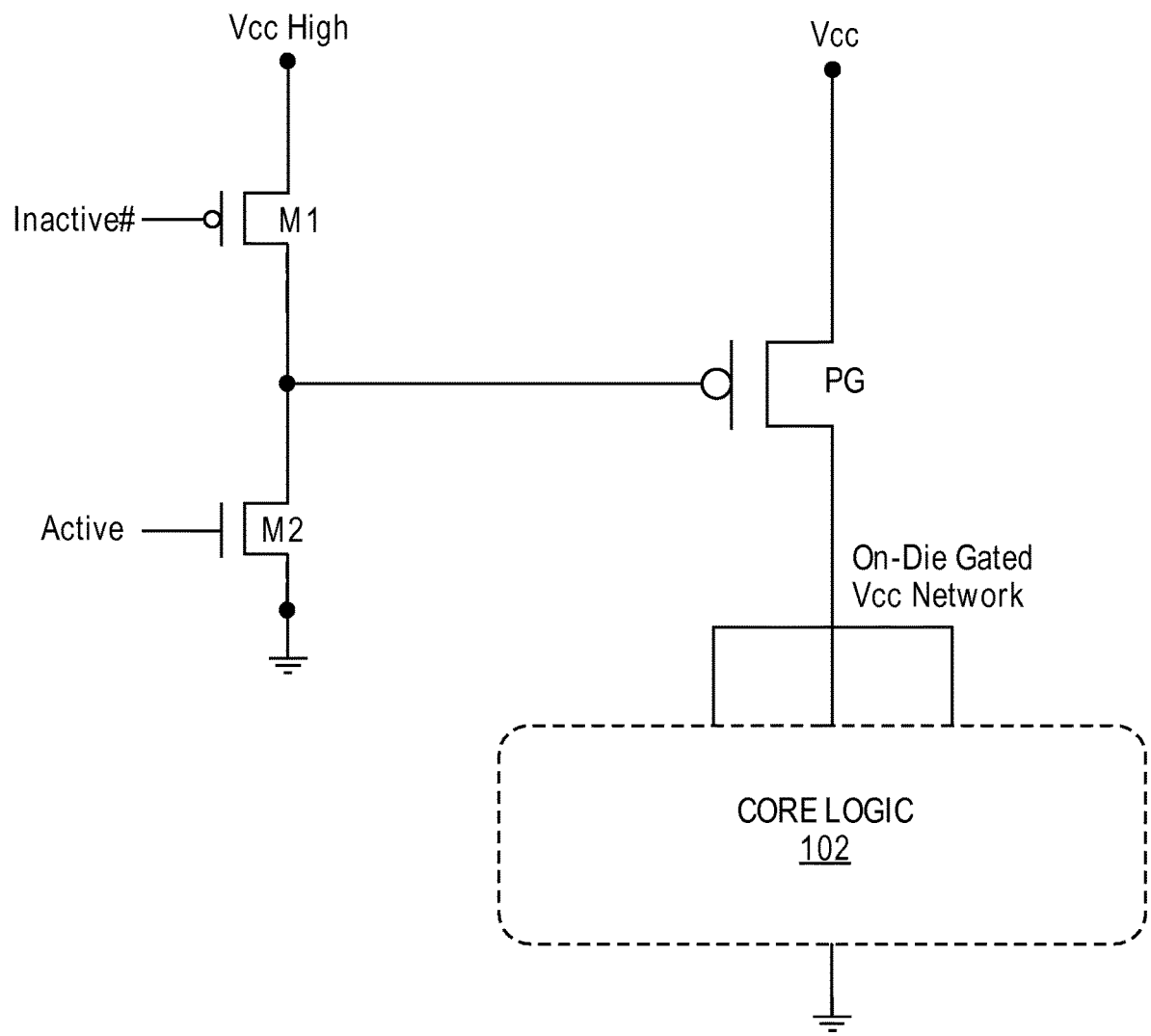
FIG. 1 shows a general diagram of a power gating scheme for supplying power to core logic in a processor.

FIG. 1 shows a general diagram of a power gating scheme for supplying power to core logic in a processor. Representatively, a P-type gate labeled "PG" is connected in series between ungated power supply ($V_{DD}$) and core logic 102. The P-type gate labeled PG is represented with a single P-type transistor. It is appreciated that numerous (e.g., hundreds of thousands or millions) of PG transistors may be utilized over a region of an integrated circuit structure. In addition, while core logic 102 is shown, any functional group(s) of circuitry in any suitable integrated circuit may be gated as described herein. Control transistors M1, M2 are connected as shown and controlled with Inactive # signal (M1) and an Active signal (M2). When Inactive # is asserted (Low), Active will be de-asserted (Low), which causes an increase supply ($V_{DD}$ High) to be applied to PG to turn it off, which decouples (or strongly reduces) the $V_{DD}$ supply from core logic 102. When the circuit is in Active mode, the Active signal is asserted (High) and Inactive # is de-asserted (High) to turn on PG and couple the $V_{DD}$ supply to core logic 102. The use of power gates, as described herein, can allow for significant reduction of leakage powering processor chips. Power gating involves intercepting the voltage supply network from functional circuitry and may be used either on positive or negative supply branches. For simplicity sake, the description that follows primarily focuses on the use of positive power supply gating, but embodiments may also incorporated negative supply gating as well.

Figure 2:
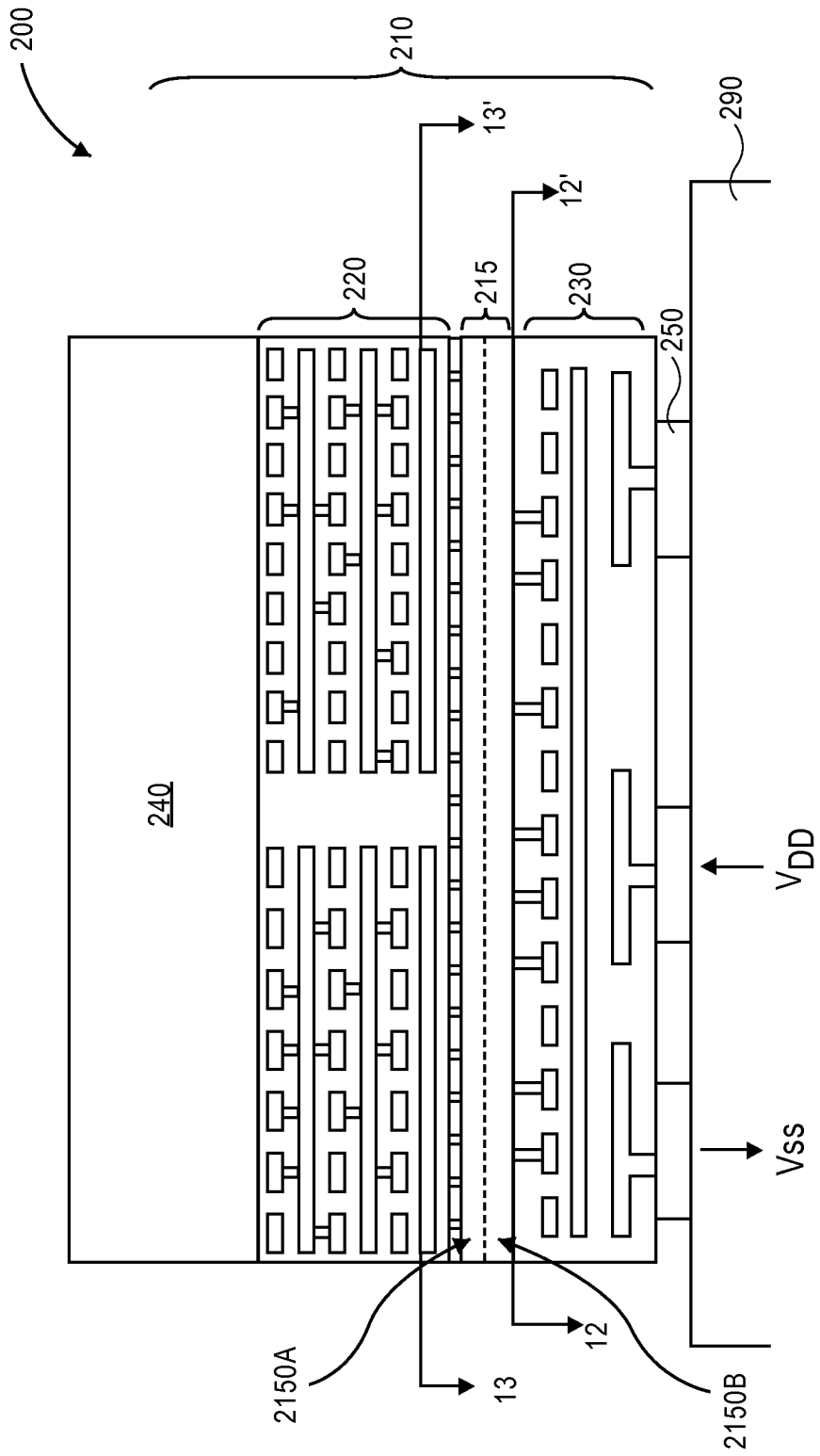
FIG. 2 shows a cross-sectional schematic side view of an embodiment of an assembly including an integrated circuit chip or die connected to a package substrate.

FIG. 2 shows a cross-sectional schematic side view of one embodiment of an assembly including an integrated circuit chip or die connected to a package substrate. Assembly 200 includes die 210 that includes device layer or stratum 215 including a number of devices (e.g., transistor devices). Device stratum 215 includes first side 2150A representing a first side of the stratum and second side or backside 2150B opposite first side 2150A. The transistor devices include one or more power transistors (also referenced herein as power gates) and logic circuitry. Connected to device stratum 215 of die 210 on a first side are interconnects 220 that, in one embodiment, include, but are not limited to, a number of conductive metal lines connected to devices of device stratum 215 from first side 2150A. Included among the interconnects are control circuitry interconnects. Disposed above signal wiring 220, as viewed, is carrier substrate 240. In one embodiment, as will be described below, carrier substrate 240 is bonded to signal wiring 220 in a process of forming die 210 with metallization on both sides of the logic circuitry. Connected to devices of die 210 through second side 2100B of the die, in this embodiment, are power interconnects ($V_{DD}$, $V_{DD}$-gated and $V_{SS}$). Interconnects 230 on second side or backside 2100B include one or more rows of metallization. Ones of such metallization are connected to contact points (e.g., C4 bumps) 250 that are operable to connect die 210 to package 290. FIG. 2 also shows $V_{DD}$ and $V_{SS}$ connections to die 210 through package substrate 290.

FIGS. 3-11C describe a method or process of forming a die including a power gate implemented in a single device stratum utilizing non-planar multi-gate semiconductor devices including electrical connections on a non-device side or backside of the stratum (underneath the devices). Such electrical connections include power wires $V_{DD}$, $V_{DD}$-gated, and $V_{SS}$. Signal wiring (control wiring), in this embodiment, is disposed above the devices. In one embodiment, the devices used in the device strata are three-dimensional metal oxide semi-conductor field effect transistors (MOSFETs).

Figure 3:
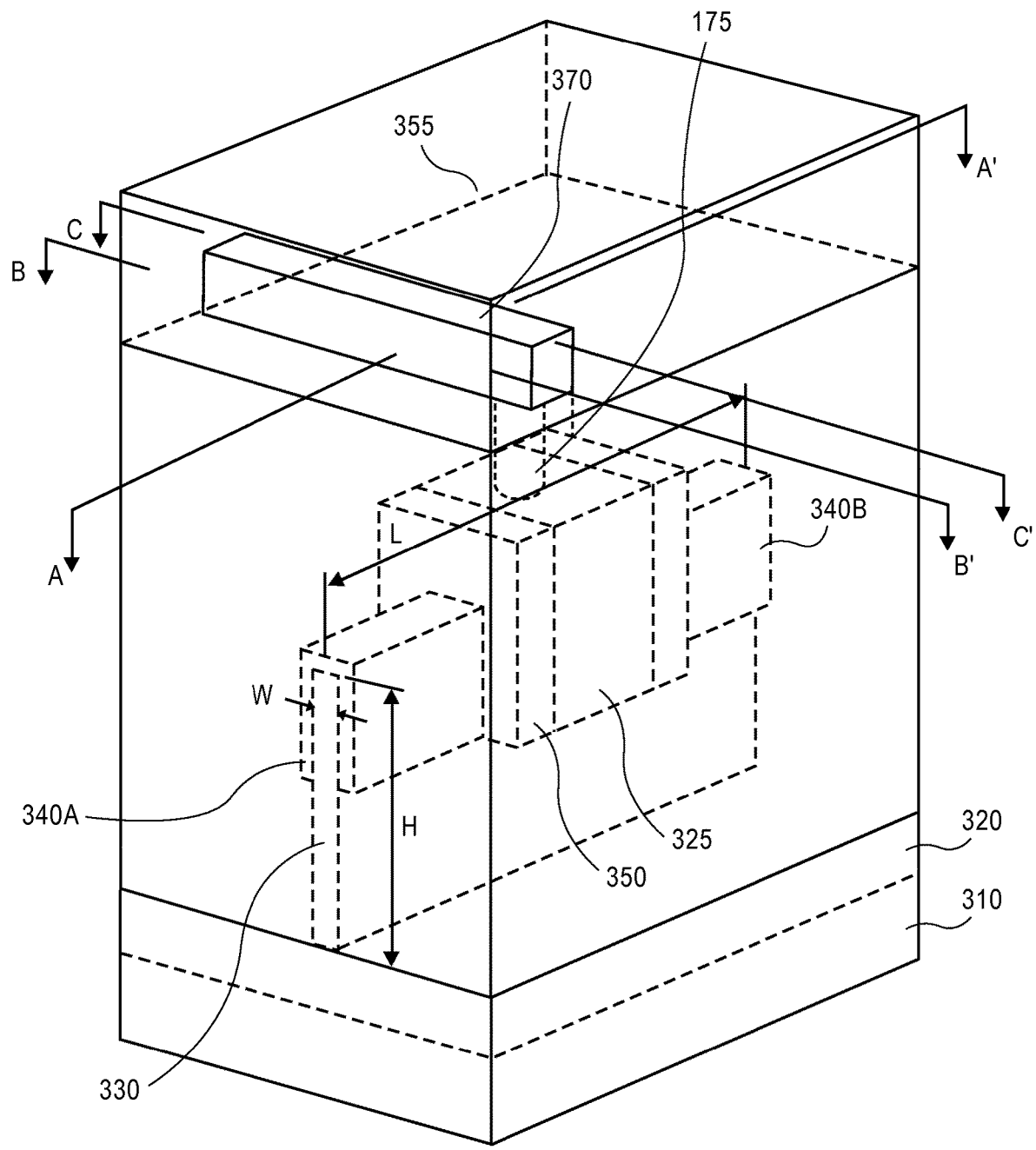
FIG. 3 shows a top side perspective view of a portion of a semiconductor or semiconductor-on-insulator (SOI) substrate that is, for example, a portion of an integrated circuit die or chip on a wafer and illustrates a three-dimensional transistor device formed thereon with an interconnect to the gate electrode of the transistor.

FIG. 3 shows a top side perspective view of a portion of a semiconductor or semiconductor-on-insulator (SOI) substrate that is, for example, a portion of an integrated circuit die or chip on a wafer. Specifically, FIG. 3 shows structure 300 including substrate 310 of silicon or SOI. Overlaying substrate 310 is optional buffer layer 320. In one embodiment, a buffer layer is a silicon germanium buffer introduced, in one embodiment, on substrate 310 by a growth technique. Representatively, buffer layer 320, if present, has a representative thickness on the order of a few hundred nanometers (nm).

Disposed on a surface of substrate 310 and optional buffer layer 320 in the embodiment illustrated in FIG. 3 (an upper surface as viewed), is a portion of a transistor device such as an N-type transistor device or a P-type transistor device. Common to an N-type or P-type transistor device, in this embodiment, is body or fin 330 disposed on a surface of buffer layer 320. In one embodiment, fin 330 is formed of a semiconductor material such as silicon, silicon germanium or a group 111-V or group IV-V semiconductor material. In one embodiment, a material of fin 330 is formed according to conventional processing techniques for forming a three-dimensional integrated circuit device. Representatively, a semiconductor material is epitaxially grown on the substrate and then formed into fin 330 (e.g., by a masking and etch process).

In one embodiment, fin 330 has a length dimension, L, greater than a height dimension, H. A representative length range is on the order of 10 nanometers (nm) to 1 millimeter (mm), and a representative height range is on the order of 5 nm to 200 nm. Fin 330 also has a width, W, representatively on the order of 4-10 nm. As illustrated, fin 330 is a three-dimensional body extending from or on a surface of substrate 310 (or optionally from or on buffer layer 320). The three-dimensional body as illustrated in FIG. 3 is a rectangular body with opposing sides (first and second sides) projecting from a surface of buffer layer 320 as viewed. It is appreciated that in processing of such bodies, a true rectangular form may not be achievable with available tooling, and other shapes may result. Representative shapes include, but are not limited to, a trapezoidal shape (e.g., base wider than top) and an arch shape.

Disposed on fin 330 in the embodiment of a structure of FIG. 3 is a gate stack. In one embodiment, a gate stack includes a gate dielectric layer of, for example, silicon dioxide or a dielectric material having a dielectric constant greater than silicon dioxide (a high k dielectric material). Disposed on the gate dielectric layer, in one embodiment, is gate 325 of, for example, a metal. The gate stack may include spacers 350 of dielectric material on opposite sides thereof. A representative material for spacers 350 is a low k material such as silicon nitride (SiN) or silicon carbon nitrogen (SiCN). FIG. 3 shows spacers 350 adjacent the sidewalls of the gate stack and on the fin 330. Formed on or in fin 330 on opposite sides of the gate stack are junction regions (source 340A and drain 340B).

In one embodiment, to form the three-dimensional transistor structure, a gate dielectric material is formed on fin 330 such as by way of a blanket deposition followed by a blanket deposition of a sacrificial or dummy gate material. A mask material is introduced over the structure and patterned to protect the gate stack material (gate stack with sacrificial or dummy gate material) over a designated channel region. An etch process is then used to remove the gate stack material in undesired areas and pattern the gate stack over a designated channel region. Spacers 350 are then formed. One technique to form spacers 350 is to deposit a film on the structure, protect the film in a desired area and then etch to pattern the film into desired spacer dimensions.

Following the formation of a gate stack including a sacrificial or dummy gate material on fin 330 and spacers 350, junction regions (source and drain) are formed on or in fin 330. The source and drain are formed in or on fin 330 on opposite sides of the gate stack (sacrificial gate electrode on gate dielectric). In the embodiment shown in FIG. 3, source 340A and drain 340B are formed by epitaxially growing source and drain material as a cladding on a portion of fin 330. Representative material for source 340A and drain 340B includes, but is not limited to, silicon, silicon germanium, or a group III-V or group IV-V compound semiconductor material. Source 340A and drain 340B may alternatively be formed by removing portions of the fin material and epitaxially growing source and drain material in designated junction regions where fin material was removed.

Following the formation of source 340A and drain 340B, in one embodiment, the sacrificial or dummy gate is removed and replaced with a gate electrode material. In one embodiment, prior to removal of the sacrificial or dummy gate stack, a dielectric material is deposited on the structure. In one embodiment, dielectric material is silicon dioxide or a low k dielectric material deposited as a blanket and then polished to expose sacrificial or dummy gate 325. The sacrificial or dummy gate and gate dielectric are then removed by, for example, an etch process.

Following a removal of the sacrificial or dummy gate and gate dielectric, a gate stack is formed in a gate electrode region. A gate stack is introduced, e.g., deposited, on the structure including a gate dielectric and gate electrode. In an embodiment, gate electrode 325 of the gate electrode stack is composed of a metal gate and a gate dielectric layer is composed of a material having a dielectric constant greater than a dielectric constant of silicon dioxide (a high-K material). For example, in one embodiment, gate dielectric layer 327 (see FIGS. 4A-4C) is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In one embodiment, gate electrode 325 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. Following the formation of the gate stack, additional dielectric material dielectric material of silicon dioxide or a low k dielectric material is deposited on the three-dimensional transistor device (e.g., on ILD0) to encapsulate or embed the device structure in dielectric material. FIG. 3 shows dielectric material 355A encapsulating the three-dimensional transistor device (e.g., as an ILD0).

FIG. 3 shows the structure following the forming of interconnects to the three-dimensional transistor device structure. In this embodiment, an electrical connection is made as a first interconnect layer or metal layer to gate electrode 325. Representatively, to form an electrical contact to gate electrode 375, an opening is initially formed to the gate electrode by, for example, a masking process with an opening in a mask to gate electrode 325. Dielectric material 355A is etched to expose the gate electrode and then the masking material removed. Next, a contact material of, for example, tungsten is introduced in the opening and the opening is filled to form contact 375 to gate electrode 325. A surface of dielectric material 355A (a top surface as viewed) may then be seeded with a conductive seeed material and then patterned with masking material to define an opening for an interconnect path with the opening exposing contact 375. A conductive material such as copper is then introduced by way of an electroplating process to form interconnect 370 connected to contact 375 of gate electrode 325. The masking material and unwanted seed material can then be removed.

Following the formation of interconnects as an initial metal layer, dielectric material 355B of for example, silicon dioxide or a low k dielectric material may be deposited as an ILD1 layer on and around the interconnects. Additional interconnect layers may then be formed according to conventional processes. FIG. 2 shows signal wiring 220 of die 210 comprised of several layers of interconnect. Interconnect 370 in FIG. 3 is representative of one, for example, a first of such layers nearest the device layer.

FIGS. 4A-4C show cross-sectional side views through the structure of FIG. 2. Specifically, FIG. 4A shows a cross-section through line A-A' through fin 330; FIG. 4B shows a cross-section through line B-B' through source 340A; and FIG. 4C shows a cross-sectional side view through line C-C' through gate electrode 325.

FIGS. 5A-5C show the structures of FIGS. 4A-4C following the inverting or flipping of the structure and connection of the structure to a carrier. FIGS. 5A-5C represent cross-sections through fin 330, drain 340B, and gate electrode 325, respectively, as described above with respect to FIGS. 4A-4C. Referring to FIGS. 5A-5C, in this embodiment, structure 300 is flipped and connected to carrier 380. Carrier 380 is, for example, a semiconductor wafer. Structure 300 may be connected to carrier 380 through an adhesive or other bonding technique.

FIGS. 6A-6C show the structure of FIGS. 5A-5C following the removal or thinning of substrate 310 to expose a second side or backside of fin 330. In one embodiment, substrate 310 may be removed by a thinning process, such as a mechanical grinding or etch process. FIGS. 6A-6C show fin 330 exposed from a second side or backside of the structure. Following exposure of fin 330, the fin may optionally be recessed. FIGS. 6A-6C show the structure following a recessing of fin 330. In one embodiment, to recess fin 330, an etch process may be utilized with an etchant selective toward a removal of fin material relative to dielectric material 355A. Alternatively, a masking material may be patterned on a surface of dielectric material 355A (an exposed backside surface) with an opening that exposes fin 330. A material of fin 330 may be removed to recess fin 330 by, for example, an etch process, and then the masking material removed.

FIGS. 7A-7C shows the structure of FIGS. 6A-6C following the deposition and patterning of a dielectric material on a backside of fin 330. FIGS. 7A-7C show dielectric material 381 of, for example, a silicon dioxide or a low K dielectric material deposited by for example, a blanket deposition process. Once deposited, dielectric material 381 may be patterned by, for example, forming a masking material on a surface of dielectric material 380 with openings or vias opposite, for example, source and drain regions on an opposite side of fin 330. FIG. 7A shows opening 382A through dielectric material 381 oriented on a backside of fin 330 corresponding to a source region of the fin (source 340A) and opening 382B through dielectric material 381 oriented to a drain region of the fin (drain 340B). FIG. 7B shows that, in this embodiment, the openings (e.g., opening 382A) have dimensions for a diameter that is greater than a width dimension of fin 330. In this manner, a backside of fin 330 as well as side walls of fin 330 are exposed. FIG. 7B also shows that the etch proceeds through the structure to expose a backside of source 340A.

FIGS. 8A-8C show the structure of FIGS. 7A-7C following an epitaxial growth of a material for a backside junction formation. FIG. 8A shows epitaxially grown material 385A in opening 382A in a region aligned with a backside of source 340A and epitaxially grown material 385B in opening 382B on fin 330 aligned with a backside of drain 340B. FIG. 8B shows material 385A epitaxially grown on the side walls of fin 330 and connecting with source 340A previously formed on a first side or device side of the structure. A suitable material is silicon germanium or a group III-V or group IV-V semiconductor material.

Figure 9C:
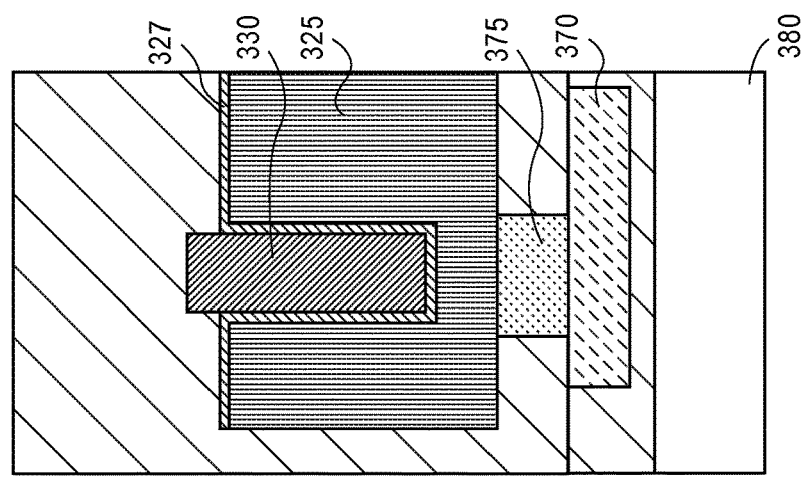
FIGS. 9A-9C show the structure of FIGS. 8A-8C following the filling of the via openings in the dielectric material with a conductive contact material such as a tungsten.
Figure 9B:
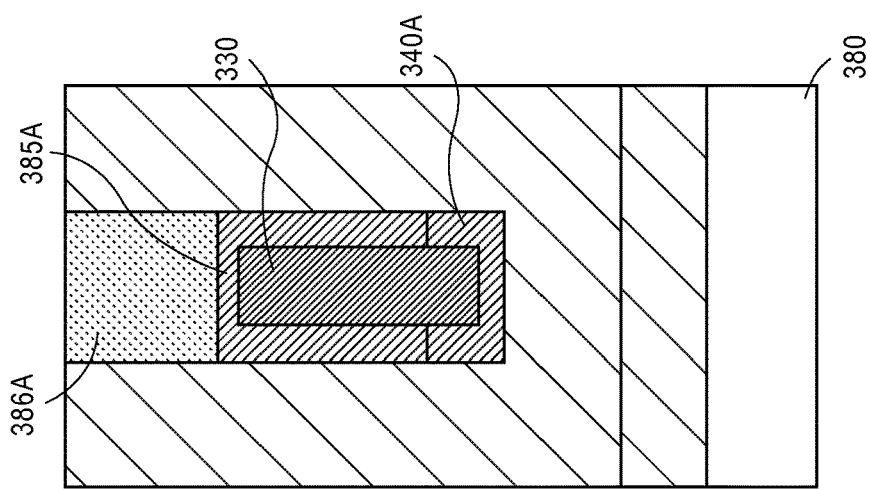
Figure 9A:
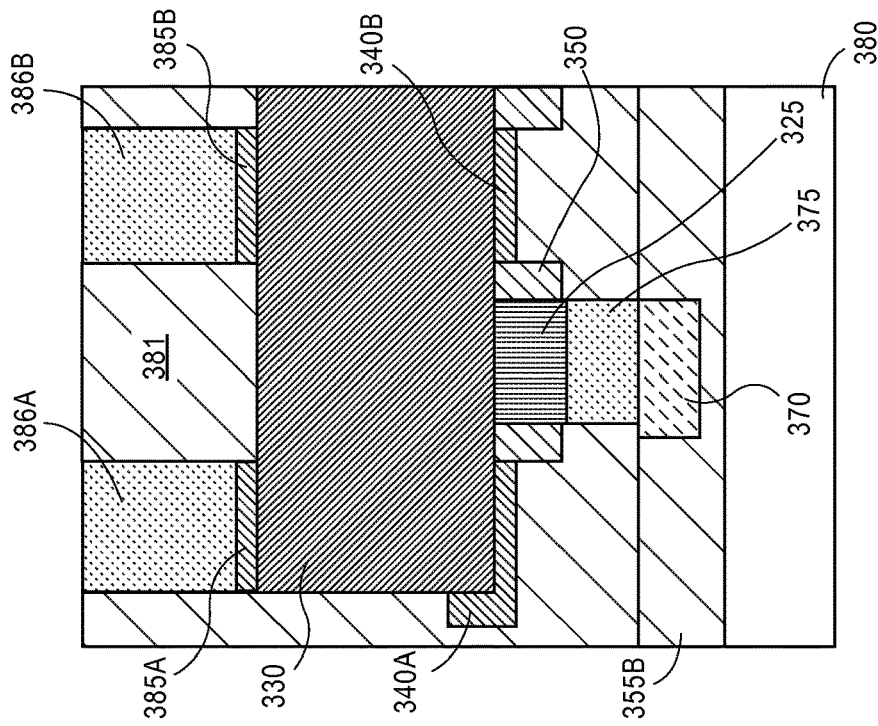

FIGS. 9A-9C show the structure of FIGS. 8A-8C following the filling of the via openings in dielectric material 380 with a conductive contact material such as a tungsten. FIG. 9A shows contact 386A to epitaxial material 385B associated with source 340A and contact metal 386B to epitaxial material 385B associated with drain 340B. FIG. 9B shows contact metal 386B to epitaxial material 385B. FIGS. 9A and 9B also show the connection to source 340A (via contact material) from a backside or second side of the structure an underside of the device stratum. Interconnects may now be formed to contacts 386A and 386B by, for example, the technique described above with respect to device side interconnects (see FIGS. 3 and 4A-4C and the accompanying text).

The above description of forming backside junction (source and drain) contacts is one embodiment. It is appreciated that there are other methods rather than an epitaxial growth of a material on the fin. Other embodiments include, but are not limited to, modifying regions of the fin from the backside by, for example, driving in dopants. In another embodiment, the sidewalls of fin 330 may be exposed in source an drain regions and a contact material such as tungsten may be introduced on such sidewalls. Where contact material is also formed on a device side of the source and drain (e.g., forming such contacts at the time of forming contact 375 to gate electrode 325), the contact may be extended in a backside processing operation to forma wraparound contact to the source and drain, respectively.

FIGS. 10A-10C shows the structure of FIGS. 9A-9C and show interconnect 390A connected to contact 396A to source 340A and interconnect 390B connected to contact 386B to source 340B as part of, for example, a first backside interconnect or metal layer. FIGS. 10A-10C also show the structure following the deposition of dielectric material 355C of silicon dioxide or a low k dielectric material on the interconnect or metal layer.

In one embodiment, a first backside interconnect or metal layer including interconnect 390A and interconnect 390B is part of or is connected to a power grid underneath or on a backside of the device stratum. Representatively, where the transistor described with reference to FIGS. 3-10C is a power gate transistor (PG in FIG. 1), source 340A is connected to $V_{DD}$ and drain 340B is connected to $V_{DD}$-gated.

Figure 11A:
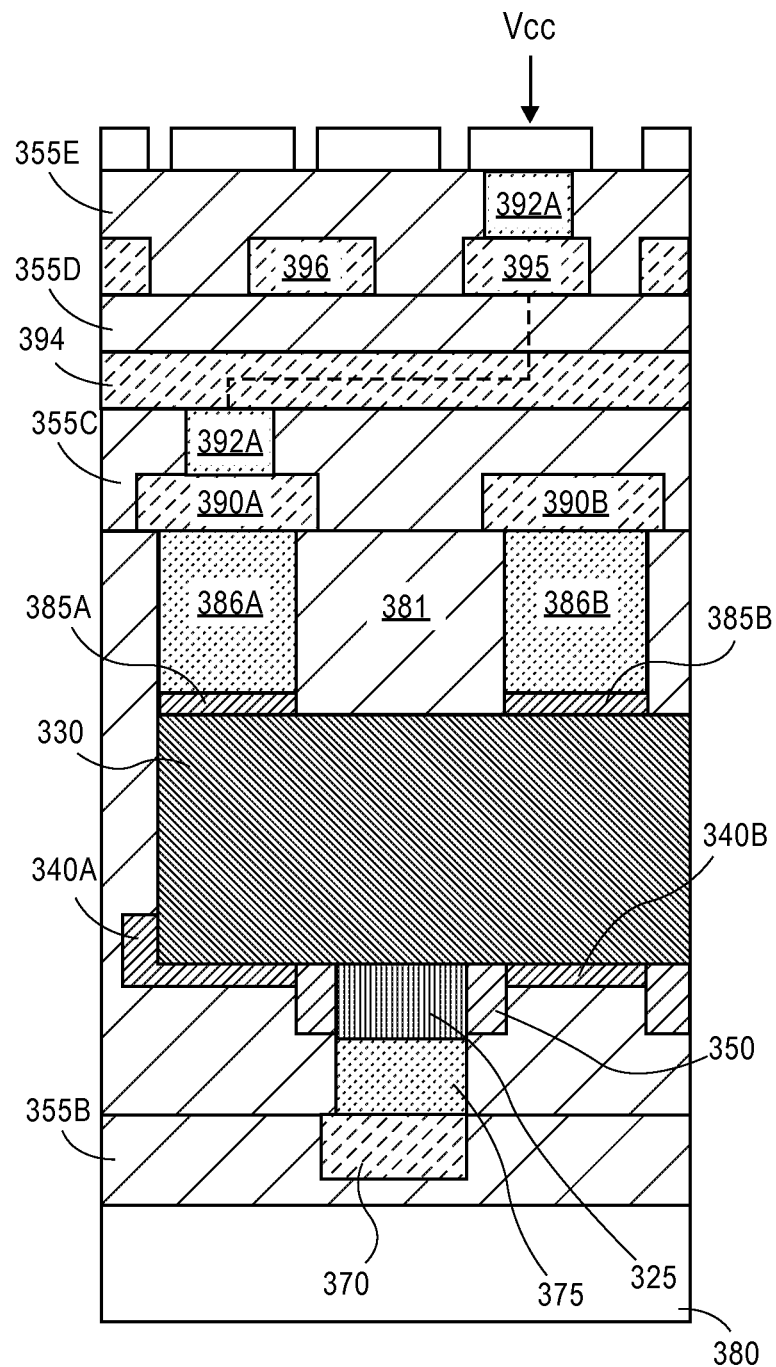
FIGS. 11A-11C show the structure of FIGS. 10A-10C following the forming of multiple interconnect layers on the structure and contact points for connection of the structure to an external substrate.
Figure 11B:
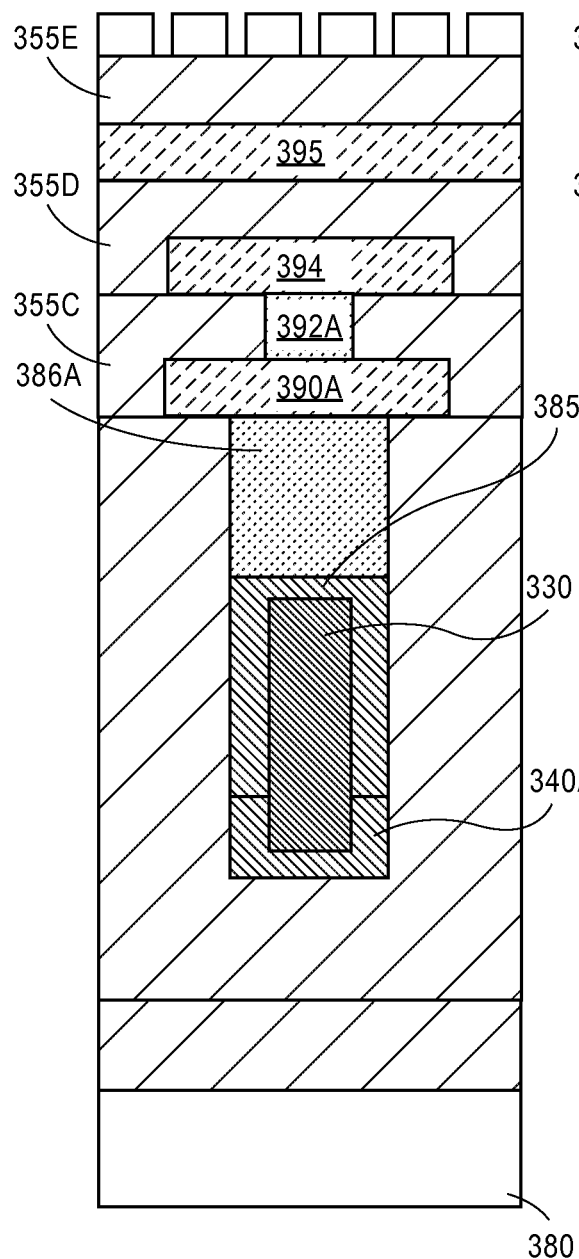
Figure 11C:
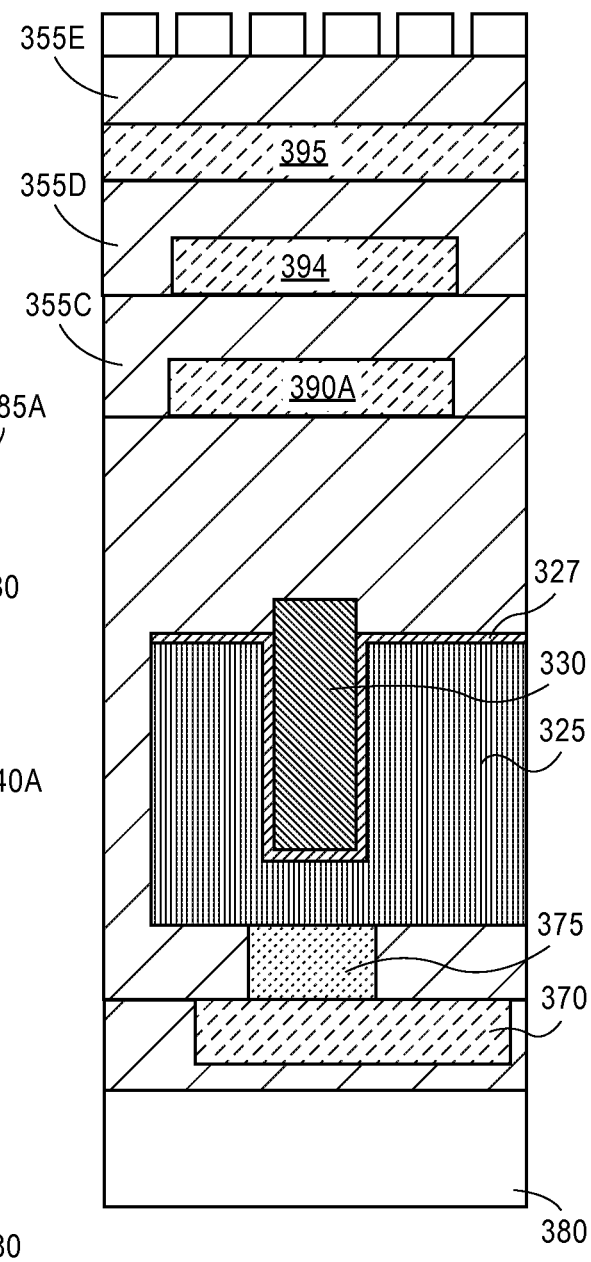

FIGS. 11A-11C show the structure of FIGS. 10A-10C following the forming of multiple interconnect layers on the structure and contact points for connection of the structure to an external substrate. The interconnects of such layers may be formed by an electroplating process. In one embodiment, such interconnects of a conductive material such as copper may be doped with a dopant to improve electromigration. FIG. 11A shows interconnect 390A that is, in one embodiment, a $V_{DD}$ line to source 340A and interconnect line 390B that is a $V_{DD}$-gated line connected to drain 340B. Interconnect 390A is connected to interconnect 394 that is, for example, a second backside level $V_{DD}$ line through contact 392A. Similarly, interconnect line 390B is connected to a second backside interconnect layer that is a $V_{DD}$-gated line that is, for example, connected to one or more other transistor devices (e.g., connected to a source of one or more transistor through an underside or backside connection that make up core logic. $V_{DD}$ interconnect line 394 is connected to a third level backside interconnect 395 that is connected to contact point 397 operable to bring power ($V_{DD}$) to the structure. As illustrated, each of the interconnect levels is separated from an adjoining level by dielectric material (dielectric material 355C, dielectric material 355D, and dielectric material 355E). Contact points 397 are, for example, C4 bumps operable to connect the structure to a substrate such as a package substrate.

Figure 12:
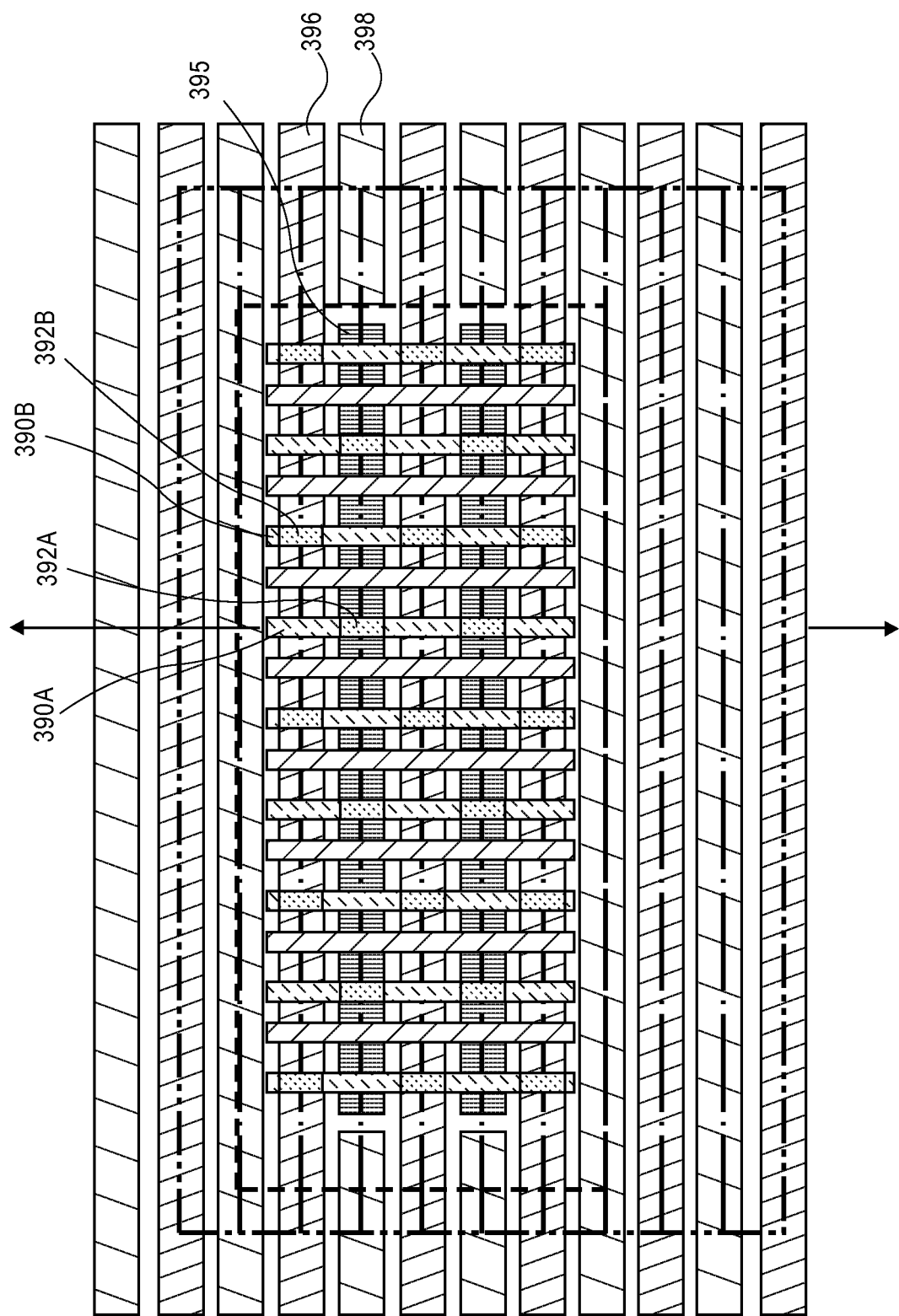
FIG. 12 shows the structure of FIG. 2 through line 12-12' and illustrates the arrangement of interconnects of metal lines underneath or on a second side of the device strata.

FIG. 12 shows the structure of FIG. 2 through line 12-12' and illustrates the arrangement of interconnects of metal lines underneath or on a second side of the device stratum. Reference numbers used in FIG. 12 are similar to those of FIGS. 11A-11C for purposes of coordinating FIG. 12 with prior discussion. In the illustration shown in FIG. 12, the dark dashed line is a region reserved for the power transistor. It is appreciated that the power transistor region could be any number of gate pitches wide. The power transistor is shown as a number of rows of $V_{DD}$ (e.g., interconnect line 395 and $V_{DD}$-gated High) (e.g., interconnect line 396). Disposed on the $V_{DD}$ and $V_{DD}$-gated High lines in the power gate region are another interconnect layer for connection to the device stratum from an underside. Overlying $V_{DD}$ and $V_{DD}$-gated lines and the power gate region are first level backside interconnects such as interconnect 390A for connection to source regions of transistor devices and interconnects 390B for connection to drain regions of interconnect devices. FIG. 12 shows contacts between the source interconnects (interconnect 390A) and a $V_{DD}$ line interconnect 395 (through contact 392A). Similarly, FIG. 12 shows contacts between drain interconnects (interconnect 390B) and a $V_{DD}$-gated line (contact 392B).

Figure 13:
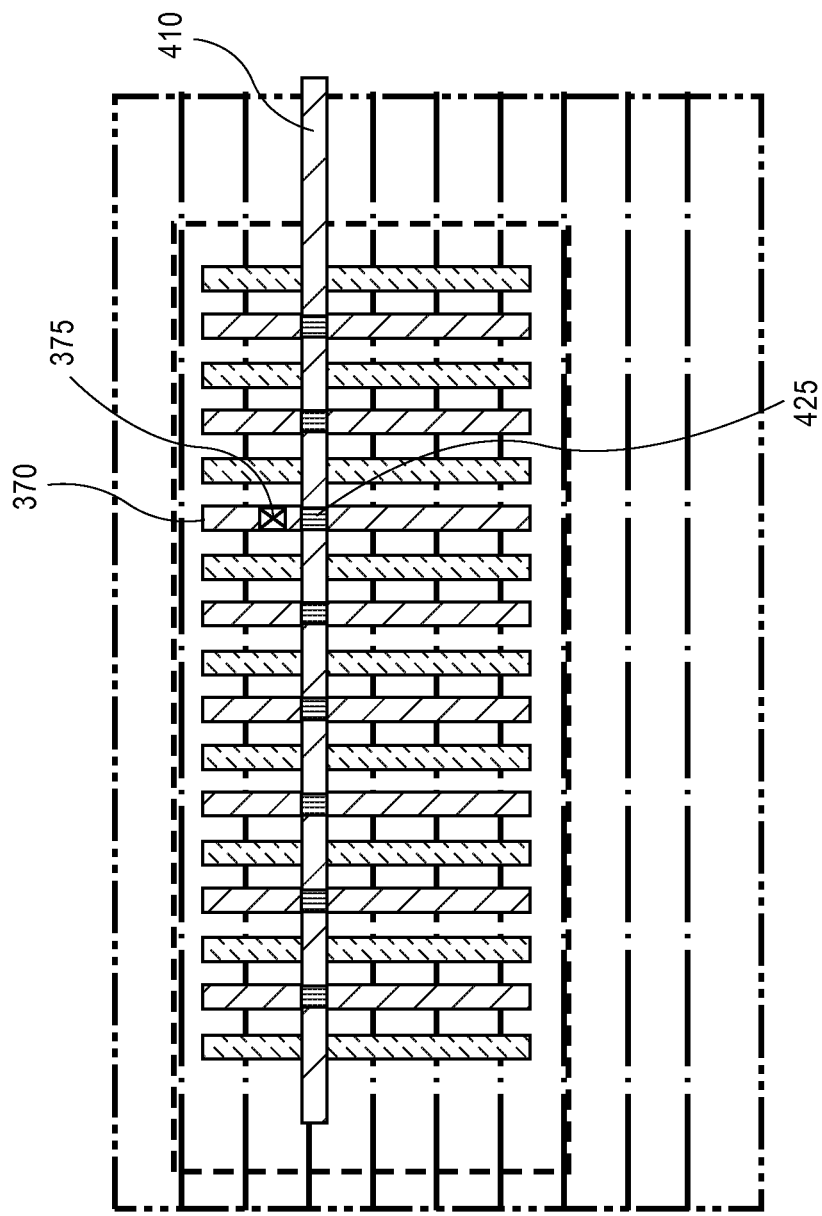
FIG. 13 shows a cross-section representatively through line 13-13' of FIG. 2 to indicate a representative routing for a control line input to the gate electrodes of the power transistors.

FIG. 13 shows a cross-section representatively through line 13-13' of FIG. 2 to indicate a representative routing for a control line input to the gate electrodes of the power transistors. Reference is again made to FIGS. 11A-11C for reference number coordination. In FIG. 13, the device layer is not shown to illustrate the metallization (e.g., three-dimensional transistors not shown). FIG. 13 shows a first level interconnection line on a first side of a device stratum (interconnect line 370) ones of those interconnect lines (e.g., interconnect line 370) are connected to gate electrodes of the field effect transistors in the power gate region. FIG. 13 shows interconnect 370 and contact 375 that extends between the interconnect and a gate electrode of a transistor device (see FIGS. 10A-10C). Overlying the first interconnect layer including interconnect layer 370 is a second interconnect layer including interconnect line 410. FIG. 13 shows the connection of interconnect line 410 to the underlying interconnect layer and illustrates contact 425 to underlying interconnect 370. Interconnect line 410 is a control line input to a gate of a field effect transistor in the power gate region of the structure (see PG in FIG. 1). The connection can be located vertically up or down (as viewed) as long as it lands on the gate electrode connection and meets other design rules.

In the above embodiments, interconnects or metal layers are disposed on both sides of a device stratum. As described, the $V_{DD}$ and $V_{DD}$-gated are gridded underneath the field effect transistor device along with $V_{ss}$ for connection to ground. As described, only the control line to a gate of a field effect transistor or power field effect transistor is disposed on a device side or first side of the device. Such control line can be fine pitch like other control lines on a device side or first side of the structure. The routing of the power lines underneath or on a second side of a device stratum preserves the routability of metal layers on a device side or first side. Providing power lines on an under side or second side of a device stratum also allows doping of the metal materials (typically copper) that form the interconnect or metal lines. Such interconnects or metal lines may be doped to achieve high electromigration prevention while keeping the additional resistance of such metal doping out of signal wires on a device side or first side of the structure. In addition, by not bringing $V_{DD}$ and $V_{DD}$-gated through the device layer silicon area for logic transistors is preserved. Still further, by positioning the power lines underneath or on a second side of a device stratum that also includes the contacts for the structure to a substrate such as a packet substrate, reduction in via resistance and metal resistance from such contact points to delivery to the power gate for $V_{DD}$ is reduced.

Figure 14:
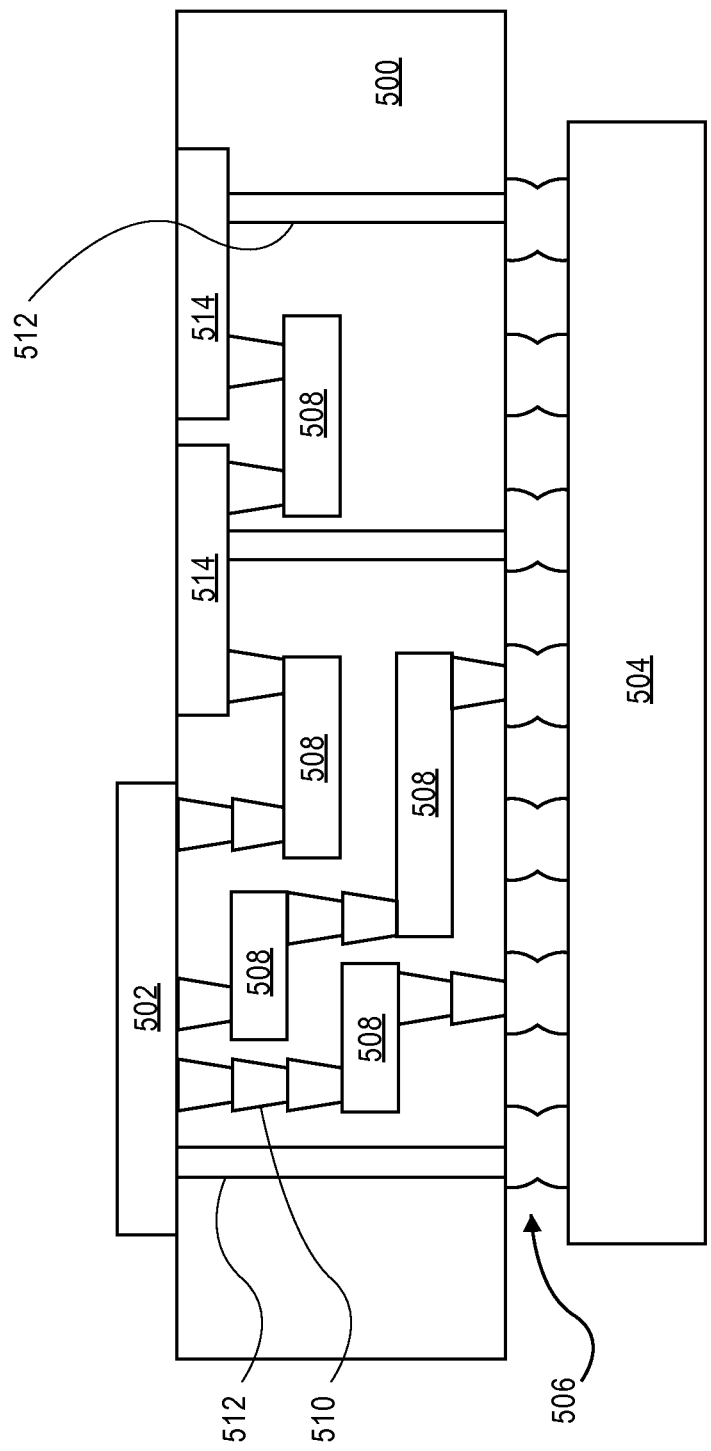
FIG. 14 is an interposer implementing one or more embodiments.

FIG. 14 illustrates interposer 500 that includes one or more embodiments. Interposer 500 is an intervening substrate used to bridge a first substrate 502 to second substrate 504. With reference to FIG. 2 above, interposer 500 may be, for example, placed between chip or die 210 and package 290. In another embodiment, first substrate 502 may be, for instance, an integrated circuit die. Second substrate 504 may be, for instance, a memory module, a computer motherboard, or another integrated circuit die. Generally, the purpose of interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of interposer 500. In other embodiments, the first and second substrates 502/504 are attached to the same side of interposer 500. In further embodiments, three or more substrates are interconnected by way of interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 500.

In accordance with embodiments, apparatuses or processes disclosed herein may be used in the fabrication of interposer 500.

Figure 15:
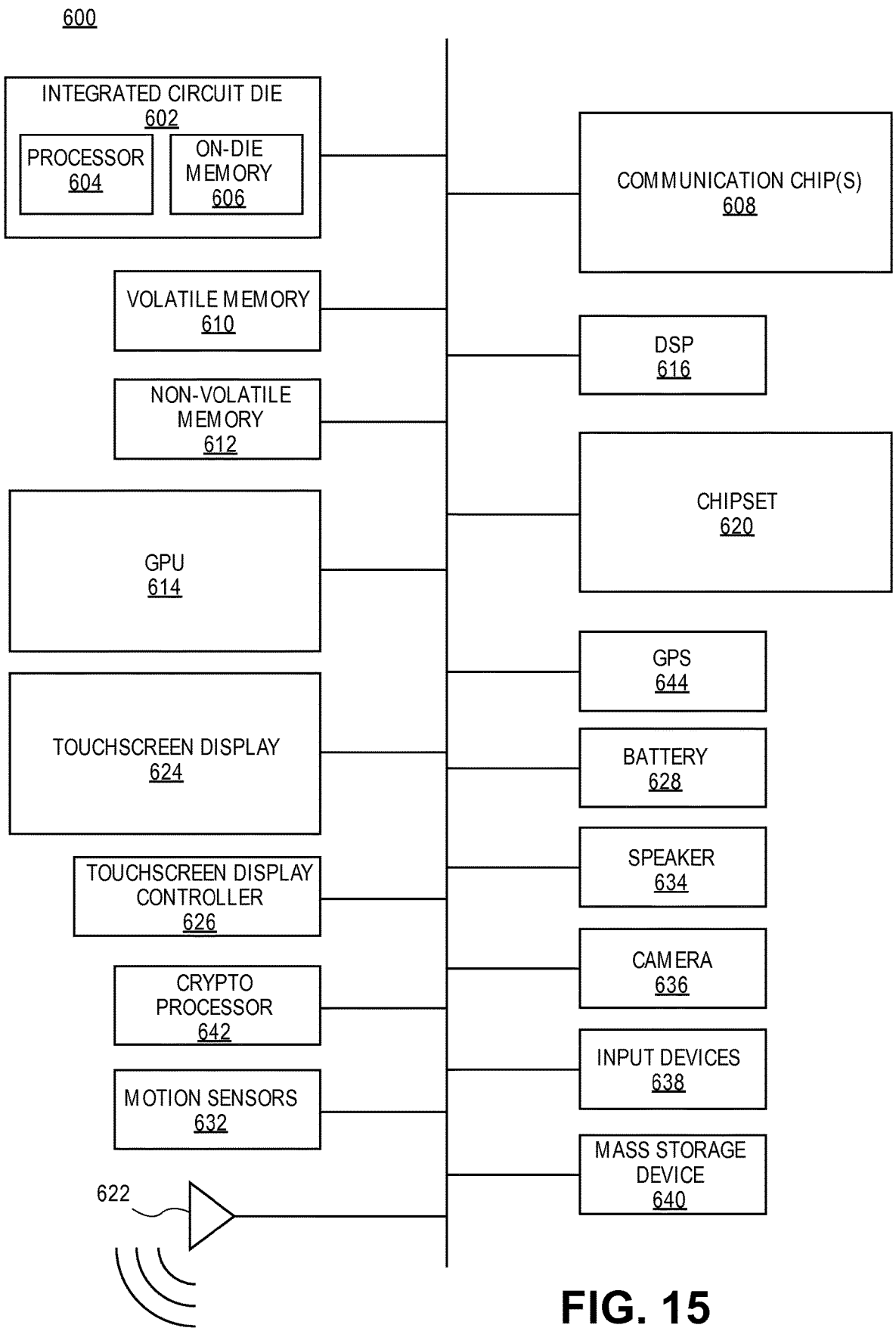
FIG. 15 illustrates an embodiment of a computing device.

FIG. 15 illustrates a computing device 600 in accordance with one embodiment. The computing device 600 may include a number of components. In one embodiment, these components are attached to one or more motherboards. In an alternate embodiment, these components are fabricated onto a single system-on-a-chip (SoC) die rather than a motherboard. The components in the computing device 600 include, but are not limited to, an integrated circuit die 602 and at least one communication chip 608. In some implementations the communication chip 608 is fabricated as part of the integrated circuit die 602. The integrated circuit die 602 may include a CPU 604 as well as on-die memory 606, often used as cache memory, that can be provided by technologies such as embedded DRAM (eDRAM) or spin-transfer torque memory (STTM or STTM-RAM).

Computing device 600 may include other components that may or may not be physically and electrically coupled to the motherboard or fabricated within an SoC die. These other components include, but are not limited to, volatile memory 610 (e.g., DRAM), non-volatile memory 612 (e.g., ROM or flash memory), a graphics processing unit 614 (GPU), a digital signal processor 616, a crypto processor 642 (a specialized processor that executes cryptographic algorithms within hardware), a chipset 620, an antenna 622, a display or a touchscreen display 624, a touchscreen controller 626, a battery 628 or other power source, a power amplifier (not shown), a global positioning system (GPS) device 644, a compass 630, a motion coprocessor or sensors 632 (that may include an accelerometer, a gyroscope, and a compass), a speaker 634, a camera 636, user input devices 638 (such as a keyboard, mouse, stylus, and touchpad), and a mass storage device 640 (such as hard disk drive, compact disk (CD), digital versatile disk (DVD), and so forth).

The communications chip 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 608. For instance, a first communication chip 608 may be dedicated to shorter range wireless communications such as Wi-Fi and Bluetooth and a second communication chip 608 may be dedicated to longer range wireless communications such as GPS, EDGE, GPRS, CDMA, WiMAX, LTE, Ev-DO, and others.

The processor 604 of the computing device 600 includes one or more devices, such as transistors or metal interconnects, that are formed in accordance with embodiments including backside contacts to device and backside metallization. The term "processor" may refer to any device or portion of a device that processes electronic data from registers and/or memory to transform that electronic data into other electronic data that may be stored in registers and/or memory.

The communication chip 608 may also include one or more devices, such as transistors or metal interconnects, that are formed in accordance with embodiments including backside contacts to device and backside metallization.

In further embodiments, another component housed within the computing device 600 may contain one or more devices, such as transistors or metal interconnects, that are formed in accordance with implementations including backside contacts to device and backside metallization.

In various embodiments, the computing device 600 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

EXAMPLES

Example 1 is an apparatus including a circuit structure including a device stratum including a plurality of transistor devices each including a first side defined by a gate electrode and an opposite second side; and a gated supply grid disposed on the second side of the structure, wherein a drain of the at least one of the plurality of transistor devices is coupled to the gated supply grid.

In Example 2, the apparatus of Example 1 further includes a supply grid disposed on the second side of the structure, wherein a source of at least one of the plurality of transistor devices is coupled to the supply grid.

In Example 3, the apparatus of any of Example 1 or 2 further includes a control line disposed on a first side of the structure, wherein the gate electrode of the at least one of the plurality of transistor devices is coupled to the control line.

In Example 4, the gate electrode of the at least one of the plurality of transistor devices of the apparatus of Example 3 is coupled to the control line through a gate contact projecting between the device and the control line and the drain of the device is coupled to the gated supply grid through a junction contact projecting between the device and the gated supply grid.

In Example 5, the drain of the at least one of the plurality of transistor devices of the apparatus of any of Examples 1-4 is coupled to the gated supply grid through a contact extending between the gated supply grid and the second side of the device.

In Example 6, the apparatus of any of Examples 1-5 further includes a contact point operable to couple the circuit structure to an external power source, the contact point disposed coupled to the supply grid on the second side of the structure.

In Example 7, the gated supply grid of the apparatus of any of Examples 1-6 includes a power grid, the apparatus further including a ground grid disposed on the second side of the structure.

In Example 8, the at least one of the transistor devices of the apparatus of any of Examples 1-7 includes a non-planar transistor device including a fin and the gate electrode is disposed on the channel region of the fin.

Example 9 is a method including providing a supply from a package substrate to power gate transistors in a device layer of a circuit structure, the transistors coupled to circuitry operable to receive a gated supply from the power gate transistors; and distributing the gated supply from the power gate transistors to the circuitry using a grid on an underside of the device layer.

In Example 10, providing a supply to power gate transistors in the method of Example 9 includes coupling to the transistors from the underside of the device layer.

In Example 11, providing a supply to power gate transistors in the method of Example 9 or 10 includes distributing the supply from the package substrate using a grid on the underside of the device layer.

In Example 12, distributing the gated supply from the power gate transistors in the method of any of Examples 9-11 includes coupling the transistors to the grid from the underside of the transistors.

In Example 13, the method of any of Examples 9-12 further includes controlling the gated supply from a control line coupled to the transistors on a side opposite the underside of the transistors.

In Example 14, the method of any of Examples 9-13 further includes distributing a ground grid on the underside of the device layer, the ground grid coupled to the circuitry.

Example 15 is a system including a package substrate including a supply connection, and a die including (i) core logic circuitry to receive one or more gated supplies, and (ii) a plurality of transistors defining a device layer and coupled between the supply connection and the core logic circuitry to controllably provide the one or more gated supplies to the core logic circuitry, wherein the gated supplies to the circuitry is routed on an underside of the device layer.

In Example 16, the one or more gated supplies in the system of Example 15 are coupled to the plurality of transistors from the underside of the device layer.

In Example 17, a supply connection to the power gate transistors in the system of any of Examples 15-16 includes a grid on the underside of the device layer.

In Example 18, distributing the gated supply from the power gate transistors in the system of any of Examples 15-17 includes coupling the transistors to the grid from the underside of the transistors.

In Example 19, the system of any of Examples 15-18 further includes controlling the gated supply from a control line coupled to the plurality of transistors on a side opposite the underside of the transistors.

In Example 20, at least one of the plurality of transistors in the system of any of Examples 15-19 includes a non-planar transistor.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
   a circuit structure comprising a device stratum comprising a plurality of transistor devices, the device stratum having a first side and a second side opposite the first side, each of the plurality of transistors comprising a gate electrode on the first side of the device stratum; and
   a gated supply grid disposed on the second side of the device stratum, wherein a drain of the at least one of the plurality of transistor devices is coupled to the gated supply grid, wherein the drain of the at least one of the plurality of transistor devices is coupled to the gated supply grid through a contact, the contact on the second side of the device stratum and extending between the gated supply grid and the second side of the device stratum but not into the device stratum.

2. The apparatus of claim 1, further comprising a supply grid disposed on the second side of the device stratum, wherein a source of at least one of the plurality of transistor devices is coupled to the supply grid.

3. The apparatus of claim 2, further comprising a contact point operable to couple the circuit structure to an external power source, the contact point coupled to the supply grid on the second side of the device stratum.

4. The apparatus of claim 1, further comprising a control line disposed on a first side of the device stratum, wherein the gate electrode of the at least one of the plurality of transistor devices is coupled to the control line.

5. The apparatus of claim 4, wherein the gate electrode of the at least one of the plurality of transistor devices is coupled to the control line through a gate contact projecting between the device and the control line and the drain of the device is coupled to the gated supply grid through a junction contact projecting between the device and the gated supply grid.

6. The apparatus of claim 1, wherein the gated supply grid comprises a power grid, the apparatus further comprising a ground grid disposed on the second side of the device stratum.

7. The apparatus of claim 1, wherein the at least one of the transistor devices comprises
a non-planar transistor device comprising a fin and the gate electrode is disposed on the channel region of the fin.

8. A system comprising a package substrate comprising a supply connection, and a die comprising:

(i) core logic circuitry to receive one or more gated supplies, and
(ii) a plurality of transistors defining a device layer and coupled between the supply connection and the core logic circuitry to controllably provide the one or more gated supplies to the core logic circuitry, the device layer having a first side and an underside opposite the first side, each of the plurality of transistors comprising a gate electrode on the first side of the device layer, wherein the gated supplies to the circuitry is routed on the underside of the device layer, wherein a drain of at least one of the plurality of transistors is coupled to the gated supplies through a contact, the contact on the underside of the device stratum and extending between the gated supplies and the underside of the device layer but not into the device layer.

9. The system of claim 8, wherein the one or more gated supplies are coupled to the plurality of transistors from the underside of the device layer.

10. The system of claim 8, wherein a supply connection to the power gate transistors comprises a grid on the underside of the device layer.

11. The system of claim 8, wherein distributing the gated supply from the power gate transistors comprises coupling the transistors to the grid from the underside of the device layer.

12. The system of claim 8, further comprising controlling the gated supply from a control line coupled to the plurality of transistors on the first side of the device layer.

13. The system of claim 8, wherein at least one of the plurality of transistors comprises a non-planar transistor.

* * * * *